United States Patent [19]

Mametsa et al.

[11] Patent Number: 4,857,850

[45] Date of Patent: Aug. 15, 1989

[54] PASSIVE-DECOUPLING RECEIVING ANTENNA, IN PARTICULAR FOR A NUCLEAR MAGNETIC RESONANCE IMAGING APPARATUS

[75] Inventors: Henri-José Mametsa, Montigny le Bretonneux; Hervé Jacob, Gyf sur Yvette, both of France

[73] Assignee: General Electric CGR SA., Paris, France

[21] Appl. No.: 189,803

[22] Filed: May 3, 1988

[30] Foreign Application Priority Data

May 7, 1987 [FR] France ................ 87 06488

[51] Int. Cl.$^4$ .......................... G01R 33/20
[52] U.S. Cl. .................................. 324/318
[58] Field of Search ........... 324/311, 318, 322, 307; 128/653

[56] References Cited

U.S. PATENT DOCUMENTS 4,724,389 2/1988 Hyde et al. ............... 324/318
4,752,738 6/1988 Patrick et al. ............. 324/318

FOREIGN PATENT DOCUMENTS 0142077 5/1985 European Pat. Off. .
0145915 6/1985 European Pat. Off. .

Primary Examiner—Stewart J. Levy
Assistant Examiner—Kevin D. O'Shea
Attorney, Agent, or Firm—Oblon, Spivak, McClelland, Maier & Neustadt

[57] ABSTRACT

An antenna for nuclear magnetic resonance imaging devices has two electromagnetic circuits connected to each other so as to produce mutual opposition of their electromotive force when they are placed in a uniform electromagnetic induction field. It is considered that a localized transmitter does not produce a uniform field. This antenna therefore makes it possible to detect this field if it comes close to this latter. On the other hand, this antenna does not present any reactive field to a transmitter in which it may be considered that the field opposite to said antenna is uniform.

13 Claims, 5 Drawing Sheets

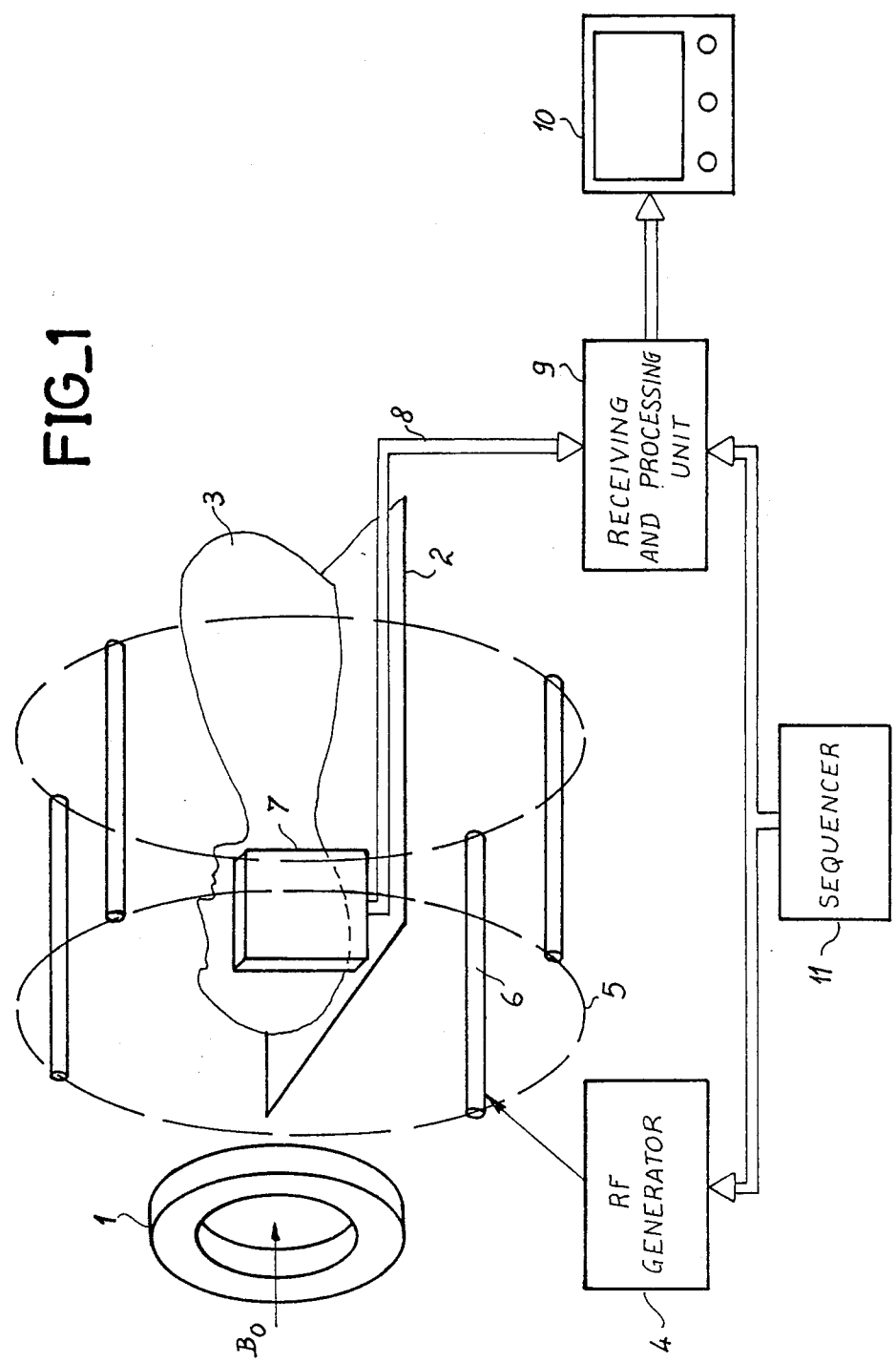

FIG_2a
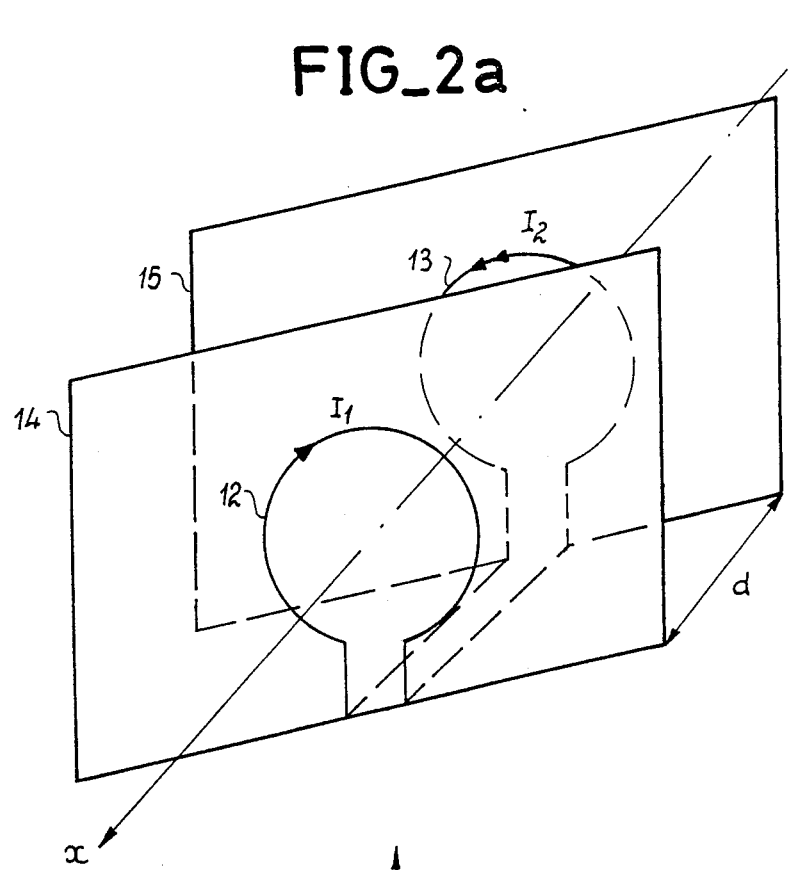
FIG_2b
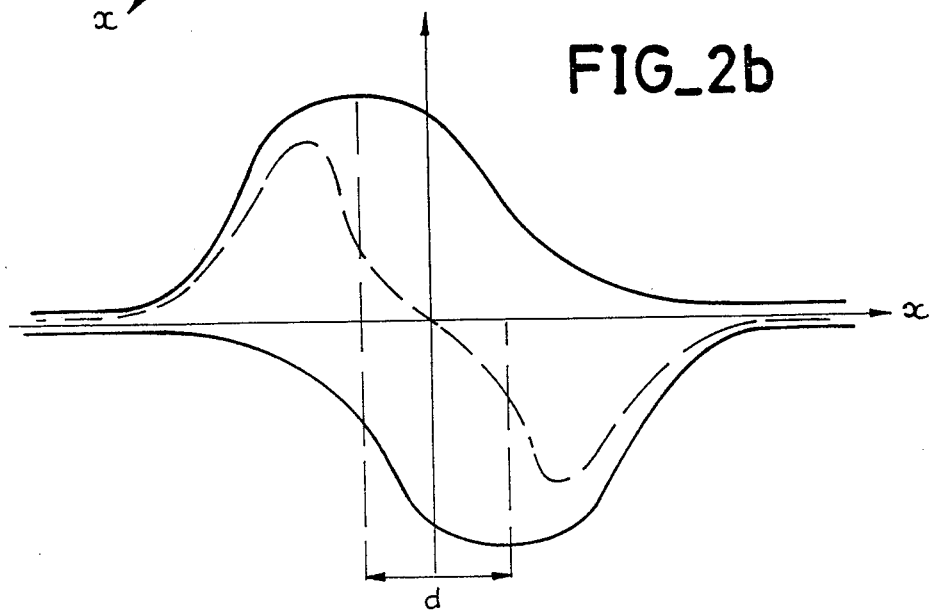

FIG_3a
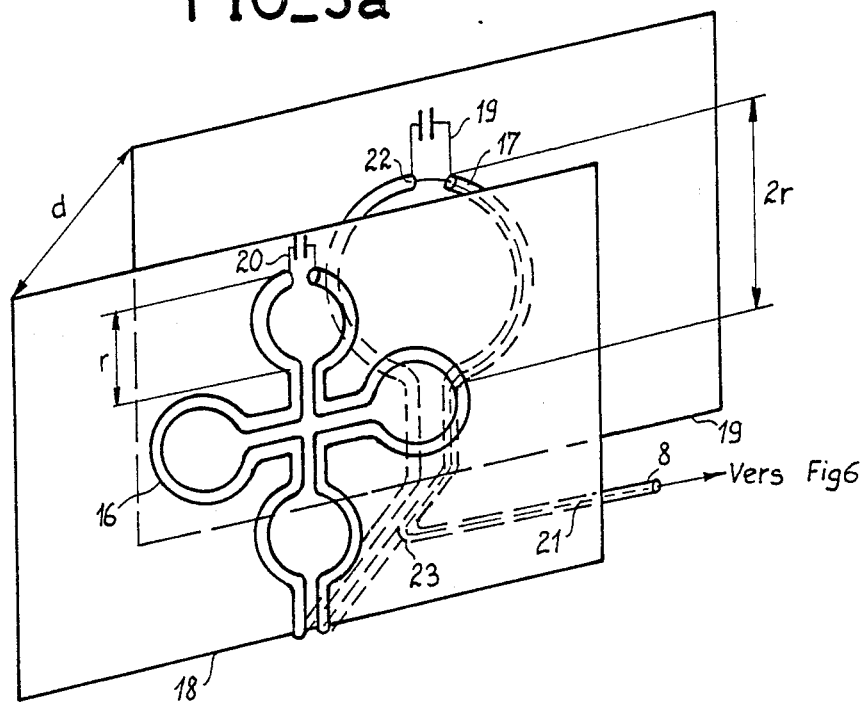
FIG_3b
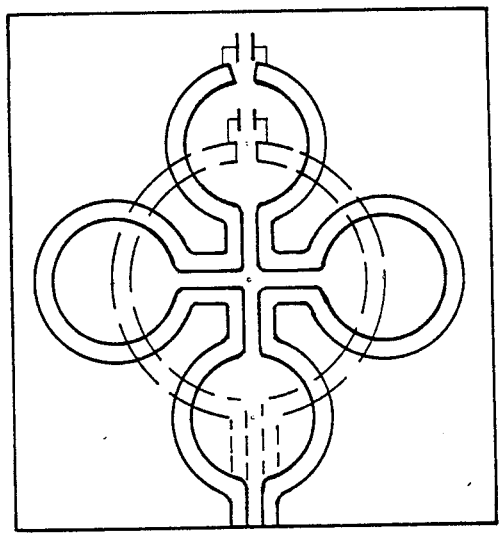

FIG_5
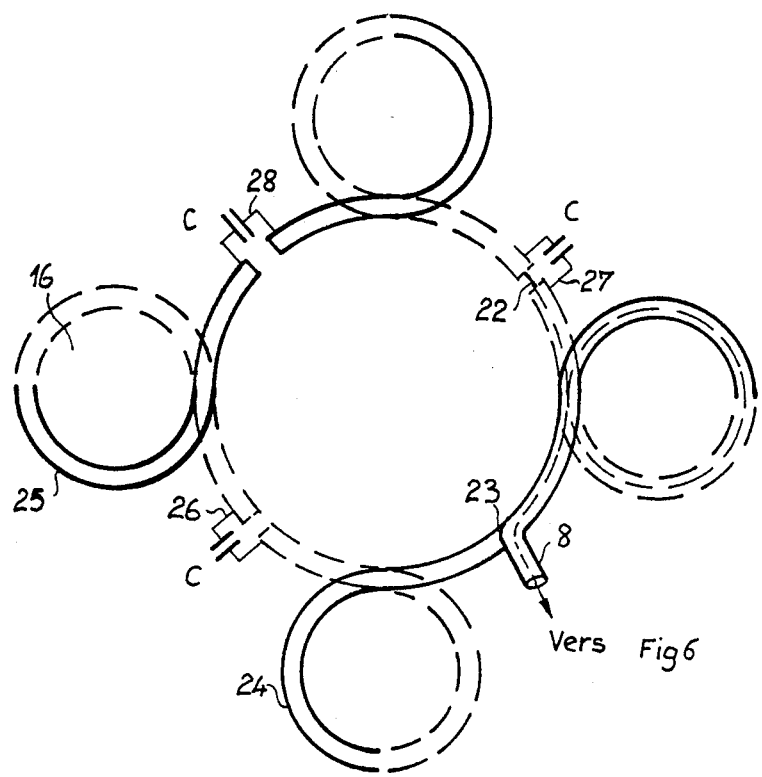
FIG_4
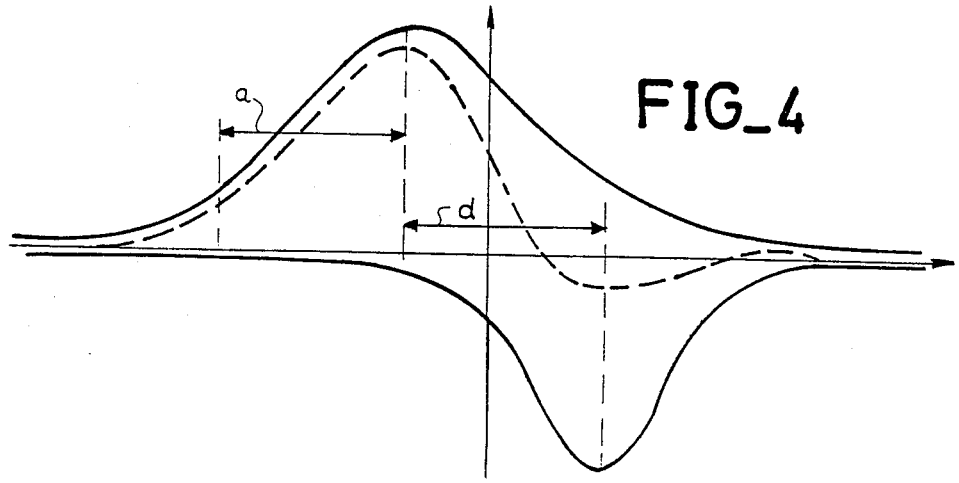

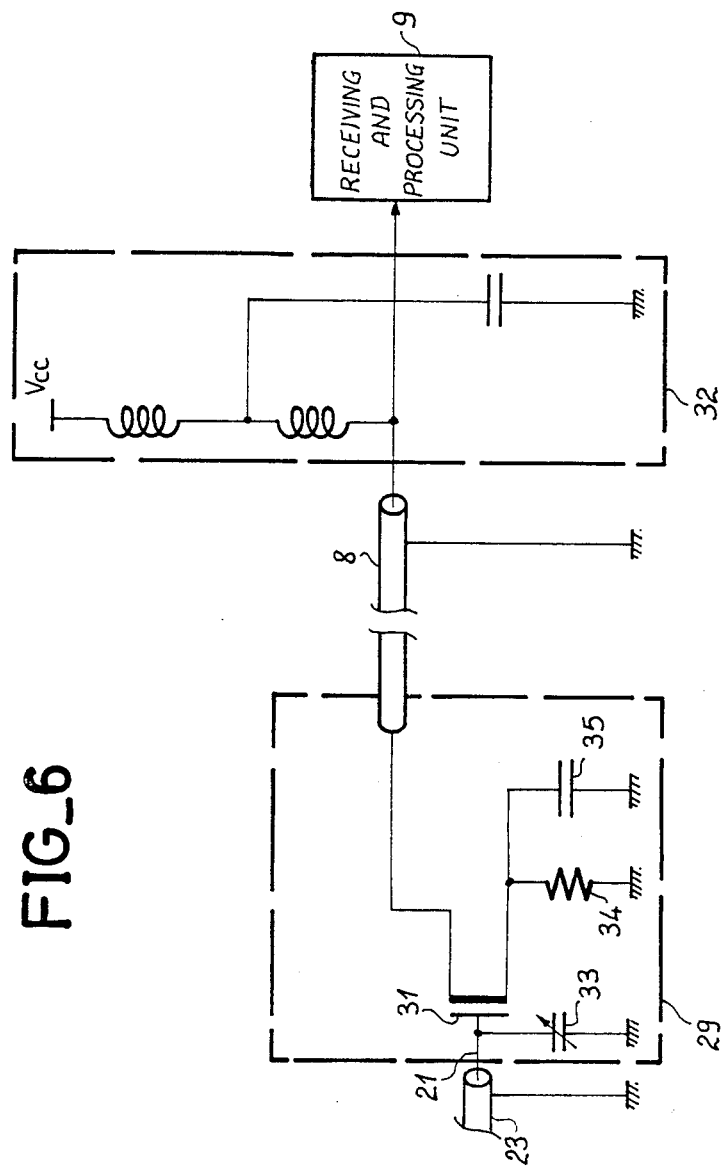
FIG_6

PASSIVE-DECOUPLING RECEIVING ANTENNA, IN PARTICULAR FOR A NUCLEAR MAGNETIC RESONANCE IMAGING APPARATUS

BACKGROUND OF THE INVENTION

1. Field of the Invention

The present invention relates to a passive-decoupling receiving antenna for a nuclear magnetic resonance (NMR) imaging apparatus. The invention is more particularly applicable to the medical field in which NMR provides a precious aid in diagnostic techniques. Applications to other fields, however, may also be contemplated.

2. Description of the Prior Art

An apparatus for NMR imaging essentially includes means for subjecting a body to be examined to a constant and intense magnetic field $B_O$. While being subjected to this influence, the body then receives a radio-frequency excitation from a transmitting antenna in order to induce resonance of oscillation of the magnetic moments of its particles. As soon as this radiofrequency excitation is discontinued, the next step consists in measuring the resonance signal emitted by the body as feedback when the magnetic moments of the particles tend to realign with the field $B_O$. In order to receive the emitted signal, it is sometimes the practice to employ so-called surface antennas which are placed on the body. The advantage of surface antennas with respect to transmitting antennas forming part of the apparatus essentially lies in the fact that they can be placed in immediate proximity to the emitting particles whereas transmitting antennas are located at a distinctly greater distance. The use of these surface antennas permits a substantially enhanced signal-to-noise ratio of the detected signal.

Surface antennas is most common use (rachis, orbit, breast, knee) are usually spatially decoupled from the transmitting antenna. Said transmitting antenna is usually horizontally polarized so as to minimize eddy-current losses in a patient who is lying in a recumbent position within the apparatus. In the case of surface receiving antennas, these antennas are placed so as to have a vertical polarization of the magnetic field with a view to preventing coupling with the transmitting antenna during transmission. In fact, a strong coupling between the two antennas is highly undesirable since the reactive field induced by the receiving antenna tends to oppose that of the transmitting antenna which serves to excite the protons. At the receiving end, the problem is less crucial since the surface antenna is much closer to the useful signal source.

The spatial decoupling thus proposed is attended by disadvantages in some instances. For example, vertical polarization of the surface antenna may make it necessary for the patient to turn on one side during an examination in which this antenna is applied against his or her ear. Similarly, the patient may also be required to turn over on the couch and lie on the other side if it is desired to place the receiving antenna against his or her other ear.

The aim of the present invention is to overcome these disadvantages by proposing a receiving antenna which is provided with means for decoupling the two antennas during transmission while at the same time ensuring symmetrization of the antenna for receiving the resonance signal as well as converting its impedance for transmission of said signal. In other words, even when placed in a position parallel to a transmitting antenna which is a body antenna, said receiving antenna is insensitive to the uniform field of this latter. This result is obtained without degradation of the signal on reception. This receiving antenna therefore permits observation of any region of the body such as the ear, for instance. In addition, the patient is no longer required to lie on one side.

SUMMARY OF THE INVENTION

The invention accordingly relates to a passive-decoupling receiving antenna, in particular for a nuclear magnetic resonance imaging apparatus, as distinguished by the fact that said antenna has two adjacent and opposing magnetic circuits for mutually opposing their induced electromotive force when these induced electromotive forces are induced by a transmitter which emits a substantially uniform field opposite to said antenna, the first circuit being constituted by one or a plurality of magnetic loops, the second circuit being constituted by a plurality of magnetic loops having a total area which is substantially equal to the area of the loops of the first circuit, and that the plane of the loops of the second circuit is displaced with respect to the plane of the loops of the first circuit.

BRIEF DESCRIPTION OF THE DRAWINGS

FIG. 1 illustrates an NMR imaging apparatus equipped with an antenna in accordance with the invention.

FIGS. 2a and 2b are respectively a schematic diagram and an operating diagram of said antenna.

FIGS. 3a and 3b illustrate one example of construction of an antenna in accordance with the general principle of the invention.

FIG. 4 is an operating diagram of the antennas of the preceding example.

FIG. 5 illustrates another example of construction.

FIG. 6 illustrates a receiving circuit of the apparatus of FIG. 1 including an amplifier having a high input impedance and its electric biasing circuit.

DESCRIPTION OF THE PREFERRED EMBODIMENTS

FIG. 1 shows an NMR imaging apparatus provided with an element 1 for producing an intense magnetic field $B_O$. A table 2 supports a body 3 which is subjected to the influence of said field. A generating unit 4 produces radiofrequency excitation of a transmitting antenna 5. By way of example, this transmitting antenna has four radiating conductors such as the conductor 6. At the receiver, the signal is collected by a surface antenna 7 which is endowed with the improvement in accordance with the invention. This surface antenna is symmetrized and matched. The signal detected by the antenna is directed via a high-frequency line 8 to receiving and processing circuits 9 which are in turn connected to visual display means 10 for observing cross-sectional images of regions examined within the body 3. A sequencer 11 controls the generating unit 4 as well as the receiving and processing unit 9.

FIGS. 2a and 2b illustrate the general principle of an antenna in accordance with the invention. The opposing action of the electromotive forces induced in the two circuits appears in the form of counterrotating currents induced within each of these circuits when they are subjected to one and the same field. Two loops 12, 13 having the same area and placed on supports 14, 15 are in fact connected to each other in series so that, in a uniform field, the currents induced within the loops act in opposition and cancel each other (hence the term "counterrotating"). However, just as the influences exerted by a transmitter located at a distance from the antenna in accordance with the invention have no effect on this latter insofar as these influences on both portions of the antenna are of the same magnitude, so the influences exerted by a transmitter located in proximity to the antenna may be differentiated. FIG. 2b shows the progressive variation of the reactive field set up in opposition to an external induction by each loop as a function of an abscissa measured on an axis x perpendicular to the plane of the loops. At a substantial distance from these loops or in other words a distance corresponding to at least once their diameter, these fields which are fictitiously opposed (on account of the reverse electrical connection) accordingly have the effect of canceling each other. In proximity to the antenna, one of the two fields is predominant according to the side considered. In consequence, an emitter (the protons which are excited within the body and return to their state of equilibrium after excitation) which is placed at this location in close proximity to the antenna has a greater influence on one of the loops than on the other. One of the two induced currents is preponderant over the other, with the result that a signal can therefore be detected. The dashed-line curve virtually indicates the sensitivity of the antenna thus provided. A number of different forms of circuit based on this principle may be contemplated.

In NMR imagery, the maximum useful signal must be detected on reception. It is apparent from FIG. 2, however, that if the patient is placed next to the loop 12, the induced current $I_2$ within the loop 13 opposes the current $I_1$ of the main loop 12. In order to minimize this effect, it would be possible to increase the distance d between the two loops. However, the basic assumption in regard to uniformity of field of the transmitting antenna makes it necessary on the contrary to place the loops at a short distance from each other. In order to arrive at a compromise in regard to this problem, the secondary loop is preferably constituted by n small loops having a total area which is equal to that of the large loop. In this manner, the induced reactive fields are compensated when they originate from a distant (uniform) transmitter as is the case with the transmitting antenna. Preferably, the axes of these secondary loops are located in uniformly spaced relation to each other and to the main axis in order to place these loops at a distance from the main circuit. FIGS. 3a and 3b and then FIG. 5 present two examples of construction in which the secondary circuit is constituted by four small loops.

In FIG. 3a, the set of small loops 16 of the secondary circuit and the main loop 17 are placed on supports 18, 19 spaced at a distance d. The small loops 16 and the main loop 17 are in series and are preferably circular in all cases. The area of each small loop is substantially equal to one-quarter of the area of the large loop. Capacitors 19, 20 serve to induce resonance respectively in the large loop and in the secondary loops. The position of the capacitors within the loops makes it possible to have a zero mean voltage at the terminals of the large loop (and ipso facto of all the secondary loops). FIG. 3b shows that the axes of the small loops are located at a distance from the center of the main loop which is preferably equal to the radius r of this latter. A screened conductor 21 is connected to a hot point 22 of the main loop. The hot point 22 is located half-way along the main loop 17. The screen 23 of the conductor 21 also serves as a screen for the loop 17. Said screened conductor makes it possible to symmetrize the antenna and to return the signal to an amplifier having a high input impedance which also has the function of impedance conversion. Symmetrization results from connection of the core 21 of the screened conductor to the loop 17 at the hot point 22 of the capacitor 19. The amplifier is driven by the voltage between the conductor 21 and the cold point 23.

FIG. 4 shows the operating diagram of the antennas of FIGS. 3 and 5. Whereas it may be considered that the induced reactive fields oppose each other exactly in the case of a transmitter located at a substantial distance from the antenna, compensation does not take place at a short distance. Moreover, by reason of the dissymmetry of construction of the two magnetic circuits, one of these circuits, namely the main circuit, has a much broader range of influence than the other. In consequence, the sensitivity of the antenna is not impaired to any excessive degree in its sensitive detection zone (portion a).

FIG. 5 presents another example of construction of an antenna which operates on the principle described earlier. In this embodiment, the two circuits are in series. The currents within the small loops are in opposition to the main current when the assembly is placed in a uniform field. In the same manner as in FIG. 3a, the small loops 16 of the secondary circuit are uniformly distributed about the axis of the loop of the main circuit. Construction of this embodiment, as of the other embodiments, on a single double-face printed circuit is possible. The connections 24 and 25 shown in full lines represent portions of circuit on a first face. The dashed-line connections 26 and 27 illustrate the portions on another face. Interconnection between the two faces is made by means of metallized holes, for example. Three capacitors 26 to 28 having the same value cause the entire circuit to resonate. The same technique as that described earlier permits symmetrization of the circuit and impedance matching.

The circuit 29 of FIG. 6 has the function of converting the impedance of the antenna so as to match it with that of the line 8. This circuit is placed in immediate proximity to the antenna, for example on the same support as this latter. Said circuit includes a field-effect transistor 31 supplied by a biasing circuit 32 decoupled from the high frequency. A variable capacitor 33 mounted in parallel between ground and the core 21 which is connected to the gate of transistor 31 serves to vary the resonance frequency of the antenna over a predetermined range. A bias resistor 34 and a decoupling capacitor 35 are mounted on the source of the transistor 31. The amplified signal is collected from the drain of the transistor 31 and transmitted to the processing unit 9 via the connection 8.

What is claimed is:

1. A passive-decoupling receiving antenna, in particular for a nuclear magnetic resonance imaging apparatus, wherein said antenna has two adjacent and opposing magnetic circuits for mutually opposing their induced electromotive force when these electromotive forces are induced by a transmitter which emits a substantial uniform field opposed to said antenna the first circuit being constituted by at least one magnetic loop, the second circuit being constituted by a plurality of magnetic loops having a total area which is substantially equal to area of said at least one loop of the first circuit, and wherein the plane of the loops of the second circuit is displaced with respect to the plane of said at least one loop of the first circuit, wherein each of said circuits is flat, said antenna further including a single flat support with said first circuit being mounted on one face of said support and said second circuit being mounted on a second face of said support wherein said first and second circuits are flat and are lying flat respectively on each of said faces of said single flat support.

2. An antenna according to claim 1, wherein the loops of the second circuit are in series with each other and with the loop or loops of the first circuit.

3. An antenna according to claim 1, wherein the loops are substantially circular.

4. An antenna according to claim 1 wherein said flat support is a double-face printed circuit board.

5. A passive-decoupling receiving antenna, in particular for a nuclear magnetic resonance imaging apparatus, wherein said antenna has two adjacent and opposing magnetic circuits for mutually opposing their induced electromotive force when these induced electromotive forces are induced by a transmitter which emits a substantial uniform field opposite to said antenna, the first circuit being constituted by one magnetic loop, the second circuit being constituted by a plurality of magnetic loops having a total area which is substantially equal to area of said one loop of the first circuit, and wherein the plane of the loops of the second circuit is displaced with respect to the plane of said one loop of the first circuit, and where axes perpendicular at the centers thereof to the loops of the second circuit are located at uniform intervals in space about an axis perpendicular to the loop of the first circuit.

6. An antenna according to claim 5, wherein said two circuits are mounted on the faces of a single flat support.

7. An antenna according to claim 5, wherein said first circuit has a high-frequency line section in which a ground conductor forms part of the loop of said circuit and in which a core which serve to conduct the induced electromotive-force signal is connected on the one hand to a receiving circuit and on the other hand to the remainder of said first circuit.

8. An antenna according to claim 7, wherein the receiving circuit has a high input-impedance circuit which is connected to said first circuit.

9. An antenna according to claim 5, wherein said two circuits are resonant and frequency-tuned to a resonance frequency of the apparatus by means of capacitors distributed within the circuits in such a manner as to ensure that a zero mean voltage appears at the terminals of said circuits.

10. An antenna according to claim 6, wherein said flat support is a double-face printed circuit board.

11. A passive-decoupling receiving antenna, in particular for a nuclear magnetic resonance imaging apparatus, wherein said antenna has two adjacent and opposing magnetic circuits for mutually opposing their induced electromotive force when these induced electromotive forces are induced by a transmitter which emits a substantial uniform field opposite to said antenna, the first circuit being constituted by at least one magnetic loop, the second circuit being constituted by a plurality of magnetic loops having a total area which is substantially equal to the area of said at least one loop of the first circuit, and wherein the plane of the loops of the second circuit is displaced with respect to the plane of said at least one loop of the first circuit, wherein the first circuit has a high-frequency line section in which a ground conductor forms part of said at least one loop of said circuit and in which a core which serve to conduct the induced electromotive-force signal is connected on the one hand to a receiving circuit and on the other hand to the remainder of said first circuit.

12. An antenna according to claim 11, wherein the receiving circuit has a high input-impedance circuit which is connected to the first circuit.

13. A passive-decoupling receiving antenna, in particular for a nuclear magnetic resonance imaging apparatus, wherein said antenna has two adjacent and opposing magnetic circuits for mutually opposing their induced electromotive force when these induced electromotive forces are induced by a transmitter which emits a substantial uniform field opposite to said antenna, the first circuit being constituted by at least one magnetic loop, the second circuit being constituted by a plurality of magnetic loops having a total area which is substantially equal to the area of said at least one loop of the first circuit, and wherein the plane of the loops of the second circuit is displaced with respect to the plane of said at least one loop of the first circuit, wherein said two circuits are resonant and frequency-tuned to a resonance frequency of the apparatus by means of capacitors distributed within the circuits in such a manner as to ensure a zero mean voltage appears at the terminals of said circuits.

* * * * *